United States Patent [19]
Sinn et al.
[11] Patent Number: 4,901,074
[45] Date of Patent: Feb. 13, 1990

[54] GLASS MEMBRANE KEYBOARD SWITCH ASSEMBLY FOR DOMESTIC APPLIANCE

[75] Inventors: Richard E. Sinn, St. Joseph Township, Berrien County; Robert R. Williams, Lincoln Township, Berrien County, both of Mich.

[73] Assignee: Whirlpool Corporation, Benton Harbor, Mich.

[21] Appl. No.: 139,919

[22] Filed: Dec. 31, 1987

[51] Int. Cl.[4] .......... H03K 17/967

[52] U.S. Cl. .......... 341/22; 200/5 A; 200/512

[58] Field of Search .......... 340/365 R, 365 S, 365 A; 200/5 A, 5 R, 511-512; 341/22, 26, 34; 219/10.55 B, 10.55 M, 10.57, 10.55 E, 10.55 A, 10.55 R; 178/17 C; 400/477, 479, 479.1

[56] References Cited

U.S. PATENT DOCUMENTS

| | | | |
|---|---|---|---|
| 3,887,848 | 6/1975 | Larson et al. | 200/DIG. 1 |
| 4,017,848 | 4/1977 | Tannas, Jr. | 340/365 R |
| 4,078,257 | 3/1978 | Bagley | 340/365 S |
| 4,274,093 | 6/1981 | Judge | 340/365 R |
| 4,336,529 | 6/1982 | Buan | 340/365 R |
| 4,516,112 | 5/1985 | Chen | 310/311 |
| 4,644,326 | 2/1987 | Villalobos et al. | 340/365 R |

*Primary Examiner*—Donald J. Yusko
*Assistant Examiner*—Tyrone Queen
*Attorney, Agent, or Firm*—Mason, Kolehmainen, Rathburn & Wyss

[57] ABSTRACT

A keyboard switch assembly includes a thin, flexible, glass top layer forming a membrane. Disposed on an inner surface of the glass membrane is a first conductive layer forming an electrode. Disposed beneath the first conductive layer is an insulating layer or spacer having an aperture therein that defines a switch contact area. Beneath the spacer a rigid portion of the keyboard switch assembly is provided. The rigid portion of the keyboard switch assembly includes a rigid substrate with a conductive coating formed thereon to provide a second conductive layer or electrode disposed beneath the spacer. A flexible polymer layer may further be disposed between the rigid substrate and the second conductive layer to reduce point contact degradation in the keyboard switch assembly. Decorative paint layers may be formed on the inner surface of the glass membrane between the glass membrane and the first conductive layer. Alternatively, where the layers forming the keyboard switch assembly are transparent, a decorative paint layer may be disposed on an outer surface of the rigid substrate.

24 Claims, 1 Drawing Sheet

GLASS MEMBRANE KEYBOARD SWITCH ASSEMBLY FOR DOMESTIC APPLIANCE

BACKGROUND OF THE INVENTION

1. Field of the Invention

The present invention relates to a keyboard switch assembly for a domestic appliance and, more particularly, to a glass membrane keyboard switch assembly having a rigid substrate, a thin glass top layer forming a membrane and spaced conductive layers disposed therebetween wherein the glass top layer flexes when touched by a user to bring one conductive layer in contact with the other conductive layer.

2. Description of the Prior Art

Various types of touch sensitive keyboard switch assemblies are known. One type of touch sensitive keyboard switch is a capacitive switch having a rigid glass panel and a layer of conductive material disposed on opposite sides thereof wherein one conductive layer forms a touch pad for the switch. Another type of touch sensitive keyboard switch is a membrane switch wherein a flexible membrane, typically of plastic, deforms when touched to cause a pair of spaced electrodes, disposed therebeneath, to make contact. Known capacitive touch sensitive switches are difficult to design and build and typically require extensive electronic control circuitry. Although more easily controlled and less expensive than capacitive touch sensitive switches, membrane switches are susceptible to damage or destruction due to moisture or chemical attack, mechanical abrasion or exposure to heat common in a kitchen environment.

The following patents show various types of capacitive touch sensitive switches. Crask U.S. Pat. No. 4,280,121 shows a capacitive switch wherein the key legend for the switch is controlled by an external computer. Simon et al U.S. Pat. No. 4,377,049 shows a capacitive switch wherein the layers coating both sides of the glass panel are made of a transparent conductive or semi-conductive material. Williams U.S. Pat. No. 4,394,643 shows a capacitive switch wherein the conductive layer on the side of the glass panel opposite the touch pad includes first and second conductive pads to provide a first and second capacitance between the touch pad and the respective first and second conductive pads. Ogino et al U.S. Pat. No. 4,665,324 shows a capacitive switch suitable for use in electric appliances wherein the conductive touch layer is formed of a mixture of conductive powder and glass powder baked onto the surface of the glass panel. Another type of capacitive touch sensitive switch is shown in Hilsum et al U.S. Pat. No. 4,529,968 wherein the switch includes a liquid crystal cell having a pair of glass walls with a layer of liquid crystal material disposed therebetween and a polarizer layer disposed on the outer surfaces of each of the glass walls.

Other types of known touch sensitive switches are as follows. Tannas, Jr. U.S. Pat. No. 4,017,848 shows a transparent keyboard switch having a glass substrate; switch contacts of indium tin oxide separated by a liquid dielectric spacer; and a flexible transparent top layer of plastic. Frame et al U.S. Pat. No. 4,415,781 shows a membrane switch with a glass substrate and top layer formed of a polyester film. Larson et al U.S. Pat. No. 4,420,663 shows a membrane switch wherein the top flexible layer is formed of paper. Diepers et al U.S. Pat. No. 4,495,434 shows a pressure sensitive transducer with a plastic top layer. Chen U.S. Pat. No. 4,516,112 shows a switching system in which conductors of indium tin oxide are formed on opposite sides of a transparent piezoelectric polymer, the system having a thin (0.003 in.) top cover of plastic or glass. Saito et al U.S. Pat. No. 4,594,482 shows a membrane switch with a glass substrate; switch electrodes of indium tin oxide; and a flexible upper substrate made of polyethylene terephthalate. Taguchi et al U.S. Pat. No. 4,621,178 shows a membrane switch for a microwave oven, the switch having a plastic top layer. Arakawa U.S. Pat. No. 4,646,062 shows a keyboard with a polyester film top layer disposed above a liquid crystal display. Lampen et al U.S. Pat. No. 3,968,467; Lampen et al U.S. Pat. No. 3,895,288 and House U.S. Pat. No. 4,494,105 each show a touch controlled device having a resistive material separated from a conductive material by an insulating spacer wherein either or both of the resistive and conductive materials may be flexible so as to be brought in electrical contact.

SUMMARY OF THE INVENTION

In accordance with the present invention, the disadvantages of prior art keyboard switch assemblies for domestic or household appliances have been overcome. The keyboard switch assembly of the present invention includes a glass membrane that, when depressed by the finger of a user, causes two spaced apart conductive layers to make electrical contact.

More particularly, the keyboard switch assembly of the present invention includes a thin, flexible glass top layer forming a membrane, on the inner surface of which is disposed a conductive coating forming a first conductor or electrode. Disposed beneath the first conductor or electrode is an insulating layer or spacer that may be formed, for example, of paint or an adhesive. Beneath the spacer a rigid portion of the keyboard switch assembly is provided. The rigid portion of the keyboard switch assembly includes a rigid substrate with a conductive coating being formed thereon to provide a second conductor or electrode that is disposed beneath the spacing layer. A flexible polymer layer may further be disposed between the rigid substrate and the conductive layer forming the second conductor to reduce point contact degradation in the keyboard switch assembly.

In one embodiment of the keyboard switch assembly, a decorative paint layer is formed on the inner surface of the glass top layer between the glass top layer and the conductive layer forming the first conductor. In a second embodiment, a decorative paint layer is disposed on an outer surface of the substrate, i.e., on a side of the substrate opposite to the side on which the conductive layer forming the second conductor is disposed.

The first and second conductive layers may be formed of indium tin oxide. The glass membrane may be formed of borosilicate glass having a thickness of between 0.005 in. and 0.020 in. The rigid substrate may also be formed of glass having a sufficient thickness to prevent excessive flexing of the glass membrane. Alternatively, the rigid substrate may be formed of metal wherein the metal is such that when it is laminated with the other layers of the keyboard assembly it prevents excessive flexing of the glass membrane.

The glass membrane keyboard switch assembly of the present invention is particularly suitable for use in connection with kitchen appliances since its glass top surface can withstand exposure to heat; resists moisture, chemicals and abrasion; and is easily cleaned. Further, because the keyboard switch assembly is a membrane switch assembly, it is easily controlled and inexpensive.

These and other objects, advantages and novel features of the present invention, as well as details of an illustrated embodiment thereof, will be more fully understood from the following description and the drawing.

DESCRIPTION OF THE PREFERRED EMBODIMENT

Figure 1:
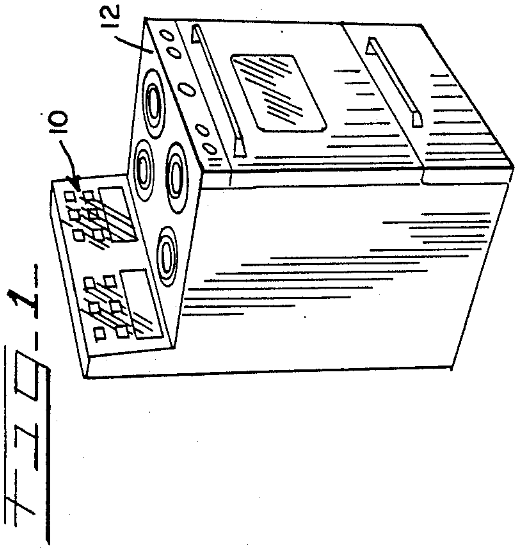
FIG. 1 is a perspective view of an electric household appliance utilizing the glass membrane keyboard switch assembly of the present invention.
Figure 2:
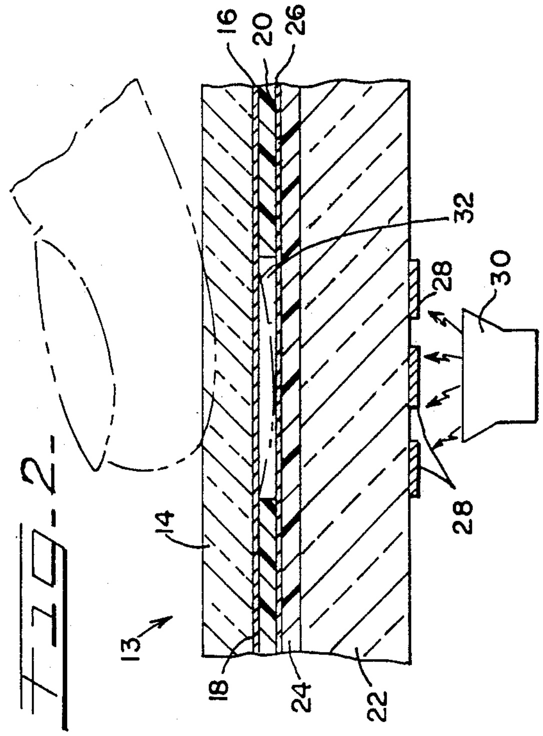
FIG. 2 is a cross-sectional view of a first embodiment of the glass membrane keyboard switch assembly of the present invention.
Figure 3:
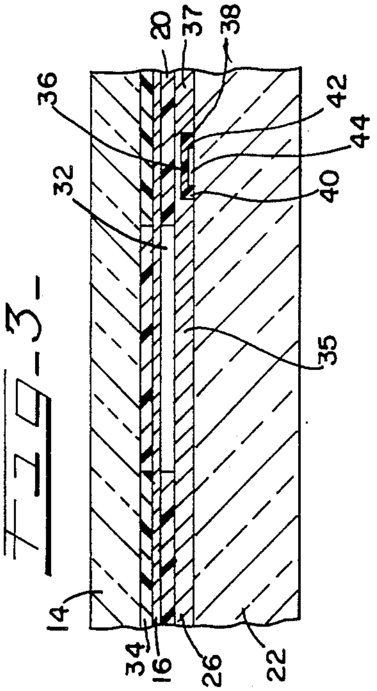
FIG. 3 is a cross-sectional view of a second embodiment of the glass membrane keyboard switch assembly of the present invention.
Figure 4:
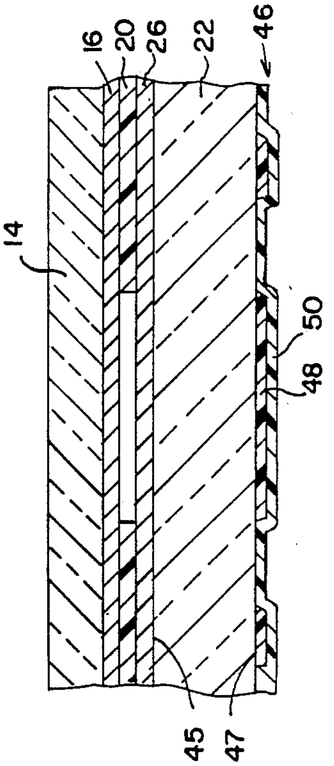
FIG. 4 is a cross-sectional view of a third embodiment of the glass membrane keyboard switch assembly of the present invention.

The glass membrane keyboard switch assembly of the present invention as shown in FIGS. 2, 3 and 4 is particularly suitable for use in connection with controls for various domestic or household appliances such as dishwashers, ranges, ovens, microwave ovens, washer/dryers, refrigerators, etc. As shown in FIG. 1, glass membrane keyboard switch assemblies constructed in accordance with the principles of the present invention may be used as input devices, generally designated 10, to control the operation of an oven 12. Because the top layer of the switch assembly forming the input device 10 is glass, it is resistant to heat, moisture, chemicals and abrasion. Further, the glass top surface of the input device 10 is easily cleaned.

As shown in FIG. 2, a glass membrane keyboard switch assembly constructed in accordance with the principles of the present invention includes a glass membrane 14, preferably formed of thin, borosilicate glass having a thickness between 0.005 inch and 0.020 inch. A conductive layer 16 of indium tin oxide, forming a row electrode for example, is formed on a surface 18 of the glass membrane 14 by sputtering, heat diffusion or the like. Disposed beneath the conductive layer 16 is an insulating layer or spacer 20 that may be formed, for example, of paint or an adhesive. The spacer 20 has an aperture 32 therein defining a switch contact area.

The keyboard switch assembly 13 also includes a rigid portion disposed beneath the spacer 20. The rigid portion includes a substrate 22 which may be formed of glass having a sufficient thickness, such as 3/16 inch, to prevent excessive flexing of the glass membrane 14. A flexible polymer layer 24 is disposed between the substrate 22 and a second conductive layer 26 to reduce point contact degradation in the keyboard switch assembly 13. The second conductive layer 26 is formed of an indium tin oxide coating disposed on the flexible polymer layer 24, the second conductive layer 26 forming, for example, a column electrode. Because each of the layers 14, 16, 26, 24 and 22 are transparent, switch legends, generally designated 28, may be painted on an outer surface of the substrate 22. These switch legends 28 may be backlit by a light source 30 if desired.

The keyboard switch assembly 13 is actuated by the touch of a user on an area of the glass membrane 14 located above the switch contact area defined by the aperture 32 in the spacer 20. When the glass membrane 14 is touched, the membrane flexes sufficiently to cause the conductive layer 16 to contact the conductive layer 26.

In a second embodiment of the keyboard switch assembly of the present invention, as shown in FIG. 3, a decorative paint layer 34 is disposed between the glass membrane 14 and the first conductive layer 16. Further, the second conductive layer 26 is formed directly on the substrate 22. In this embodiment, the second conductive layer 26 may include a jumper portion 36 to provide a connection between the conductors formed by a portion 35 and a portion 37 of the conductive layer 26 without making contact with a conductor 44 formed on the top surface of the substrate 22. The jumper portion 36 is electrically isolated from the conductor 44 by an insulating layer 38 disposed therebetween and a pair of spacers 40 and 42 disposed on the opposite sides of the conductor 44 to separate it from the portions 35 and 37 of the conductive layer 26.

In the embodiment of FIG. 3, the thickness of the glass membrane is preferably 0.016 inch. The rigid substrate 22 may be formed of glass having a thickness of 3/16 inch as ,in the embodiment of FIG. 2. Alternatively, the substrate 22 shown in FIG. 3 may be formed of metal wherein the metal is such that when it is laminated with the other layers of the keyboard switch assembly 13 it prevents excessive flexing of the glass membrane 14. Such metal backer panels can form part of an active switch circuit such as a ground plane for shorting switches. The metal backer panels can also form part of the hardware for mounting the keyboard switch assembly to the appliance, such as the oven 12, in which it is to be used.

In a third embodiment of the keyboard switch assembly of the present invention, depicted in FIG. 4, the conductive layer 26 is disposed directly on an inner surface 45 of the substrate 22 whereas a decorative paint layer 46 is disposed on the outer surface 47 of the substrate 22. The decorative paint layer may be formed of a plurality of colors such as illustrated by the paint layers 48 and 50. Because the decorative paint layer 46 is disposed on the outer surface of the substrate 22, in this embodiment, each of the layers 14, 16, 26 and 22, and preferably the layer 20, is transparent. In this embodiment, the glass membrane 14 may be 0.005 inch thick, the spacer 20 may be 0.0005 inch thick or less and the substrate 22 may be formed of glass having a thickness of 3/16 inch.

Many modifications and variations of the present invention are possible in light of the above teachings. Thus it is to be understood that, within the scope of the appended claims, the invention may be practiced otherwise than as described hereinabove.

What is claimed and desired to be secured by Letters Patent of the United States is:

1. A keyboard switch assembly for a domestic appliance comprising:

a rigid substrate;

a first conductive layer disposed above said substrate;

a solid electrically insulating spacing layer disposed above said first conductive layer and having an aperture therein, said aperture defining a switch contact area;

a second conductive layer disposed above said spacing layer and spaced from said first conductive layer by said spacing layer; and a glass top layer disposed above said second conductive layer, said glass top layer being sufficiently thin to flex causing said second conductive layer to contact said first conductive layer within said switch contact area when an area of the glass top layer located above said switch contact area is touched.

2. A keyboard switch assembly as recited in claim 1 wherein said glass top layer has a thickness of between 0.005 inch and 0.020 inch.

3. A keyboard switch assembly as recited in claim 1 wherein said glass top layer is formed of borosilicate glass.

4. A keyboard switch assembly as recited in claim 1 wherein said substrate is formed of glass of sufficient thickness to prevent damage to said glass top layer caused by excessive flexing thereof.

5. A keyboard switch assembly as recited in claim 1 wherein said first and second conductive layers are formed of indium tin oxide.

6. A keyboard switch assembly as recited in claim 1 further including a flexible polymer layer disposed between said first conductive layer and said rigid substrate to reduce point contact degradation.

7. A keyboard switch assembly as recited in claim 1 wherein said first and second conductive layers and said substrate are transparent and further including a layer of paint disposed on a side of said substrate opposite to the side of said substrate above which said first conductive layer is disposed.

8. A keyboard switch assembly as recited in claim 1 wherein said rigid substrate is formed of metal, said substrate being laminated with said other layers to prevent damage to said glass top layer caused by excessive flexing thereof.

9. A keyboard switch assembly for a domestic appliance comprising:

a rigid, transparent substrate having first and second sides;

a layer of paint disposed on said first side of said substrate;

a flexible polymer layer disposed on said second side of said substrate;

a first conductive layer disposed on said flexible polymer layer;

a solid electrically insulating spacing layer disposed above said first conductive layer and having an aperture therein, said aperture defining a switch contact area;

a second conductive layer disposed on said spacing layer and spaced from said first conductive layer by said spacing layer; and a glass top layer disposed on said second conductive layer, said glass top layer being sufficiently thin to flex causing said second conductive layer to contact said first conductive layer within said switch contact area when an area of said glass top layer located above said switch area is touched.

10. A keyboard switch assembly as recited in claim 9 wherein said glass top layer has a thickness of between 0.005 inch and 0.020 inch.

11. A keyboard switch assembly as recited in claim 9 wherein said glass top layer is formed of borosilicate glass.

12. A keyboard switch assembly as recited in claim 9 wherein said substrate is formed of glass of sufficient thickness to prevent damage to said glass top layer caused by excessive flexing thereof.

13. A keyboard switch assembly as recited in claim 9 wherein said first and second conductive layers are formed of indium tin oxide.

14. A keyboard switch assembly for a domestic appliance comprising:

a rigid substrate;

a first conductive layer disposed on said substrate;

a solid electrically insulating spacing layer disposed above said first conductive layer and having an aperture therein, said aperture defining a switch contact area;

a second conductive layer disposed on said spacing layer and spaced from said first conductive layer by said spacing layer;

a layer of paint disposed on said second conductive layer; and a glass top layer disposed on said paint layer, said glass top layer being sufficiently thin to flex causing said second conductive layer to contact said first conductive layer within said switch contact area when an area of said glass top layer located above said switch contact area is touched.

15. A keyboard switch assembly as recited in claim 14 wherein said glass top layer has a thickness of between 0.005 inch and 0.020 inch.

16. A keyboard switch assembly as recited in claim 14 wherein said glass top layer is formed of borosilicate glass.

17. A keyboard switch assembly as recited in claim 14 wherein said substrate is formed of glass of sufficient thickness to prevent damage to said glass top layer caused by excessive flexing thereof.

18. A keyboard switch assembly as recited in claim 14 wherein said first and second conductive layers are formed of indium tin oxide.

19. A keyboard switch assembly as recited in claim 14 wherein said rigid substrate is formed of metal, said substrate being laminated with said other layers to prevent damage to said glass top layer caused by excessive flexing thereof.

20. A keyboard switch assembly for a domestic appliance comprising:

a rigid, transparent substrate having first and second sides;

a layer of paint disposed on said first side of said substrate;

a first conductive layer disposed on said second side of said substrate;

a solid electrically insulating spacing layer disposed above said first conductive layer and having an aperture therein, said aperture defining a switch contact area;

a second conductive layer disposed on said spacing layer and spaced from said first conductive layer by said spacing layer; and a glass top layer disposed on said second conductive layer, said glass top layer being sufficiently thin to flex causing said second conductive layer to contact said first conductive layer within said switch contact area when an area of the glass top layer located above said switch contact area is touched.

21. A keyboard switch assembly as recited in claim 20 wherein said glass top layer has a thickness of between 0.005 inch and 0.020 inch.

22. A keyboard switch assembly as recited in claim 20 wherein said glass top layer is formed of borosilicate glass.

23. A keyboard switch assembly as recited in claim 20 wherein said substrate is formed of glass of sufficient thickness to prevent damage to said glass top layer caused by excessive flexing thereof.

24. A keyboard switch assembly as recited in claim 20 wherein said first and second conductive layers are formed of indium tin oxide.

* * * * *